United States Patent
Kim et al.

(10) Patent No.: US 7,008,817 B2
(45) Date of Patent: Mar. 7, 2006

(54) METHOD FOR MANUFACTURING MICRO ELECTRO-MECHANICAL SYSTEMS USING SOLDER BALLS

(75) Inventors: Woon-bae Kim, Suwon-si (KR); Sung-hoon Choa, Seoul (KR); Min-seog Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/784,144

(22) Filed: Feb. 23, 2004

(65) Prior Publication Data

US 2005/0009315 A1    Jan. 13, 2005

(30) Foreign Application Priority Data

Feb. 24, 2003   (KR)   ............ 10-2003-0011398

(51) Int. Cl.
 *H01L 21/44*  (2006.01)
 *H01L 21/48*  (2006.01)
 *H01L 21/50*  (2006.01)

(52) U.S. Cl. ............ 438/106; 438/456; 438/723

(58) Field of Classification Search ........ 438/106, 438/125, 455, 456, 116, 612, 723, 613
See application file for complete search history.

(56) References Cited

U.S. PATENT DOCUMENTS

| | | | |
|---|---|---|---|
| 6,300,676 B1 * | 10/2001 | Kawai | 257/678 |
| 6,388,335 B1 * | 5/2002 | Lam | 257/778 |
| 6,391,742 B1 | 5/2002 | Kawai | 438/456 |
| 6,413,799 B1 * | 7/2002 | Lam | 438/113 |
| 2002/0008311 A1 * | 1/2002 | Kimura | 257/690 |
| 2002/0088986 A1 * | 7/2002 | Kayama et al. | 257/99 |
| 2002/0146859 A1 * | 10/2002 | Akagawa | 438/106 |
| 2003/0102566 A1 * | 6/2003 | Farnworth | 257/774 |
| 2004/0035917 A1 * | 2/2004 | Koopmans | 228/215 |

FOREIGN PATENT DOCUMENTS

JP   10213441   8/1998

* cited by examiner

*Primary Examiner*—W. David Coleman
*Assistant Examiner*—Khiem Nguyen
(74) *Attorney, Agent, or Firm*—Lee & Morse, P.C.

(57) ABSTRACT

A method for manufacturing micro electro-mechanical systems includes forming an insulation layer on an upper surface of a semiconductor substrate, forming a structure layer on an upper surface of the insulation layer and etching the structure layer, forming an under bump metal on a predetermined position of an upper surface of the structure layer, forming a via hole in a glass substrate corresponding to the position of the under bump metal and in a shape such that the via hole is larger in diameter at an upper surface of the glass substrate than at a lower surface of the glass substrate, wherein the glass substrate is bonded to the upper surface of the structure layer and creates a vacuum chamber that protects a structure of the structure layer, and arranging a solder ball in the via hole and bonding the solder ball to the under bump metal.

20 Claims, 6 Drawing Sheets

METHOD FOR MANUFACTURING MICRO ELECTRO-MECHANICAL SYSTEMS USING SOLDER BALLS

BACKGROUND OF THE INVENTION

1. Field of the Invention

The present invention relates to a method for manufacturing micro electro-mechanical systems using solder balls. More particularly, the present invention relates to a method for manufacturing micro electro-mechanical systems that achieves efficient electrical connection between an internal structure and external electronic parts, and that protects the internal structure by preventing penetration of external air into a vacuum chamber during manufacture of wafer level packaging elements such as an angular velocity sensor, an acceleration sensor, a gyroscope sensor or a pressure sensor.

2. Description of the Related Art

Fabricating micro electronic parts such as an angular velocity sensor or an acceleration sensor with silicon micro-mechanical technology is becoming very popular. Electronic parts of silicon micro-mechanical technology generally include a silicon substrate and two glass substrates bonded onto upper and lower surfaces of the silicon substrate. A structure for detecting angular velocity is formed on the silicon substrate, and the structure and silicon substrate are sealed by the two glass substrates.

A method is known in the prior art for mounting micro electronic parts onto a surface of a circuit board using such technology. In order to manufacture a compact-sized circuit board, it is essential that a mounting surface of the micro electronic parts be reduced. Therefore, a method of manufacturing a micro electronic part has been used in which a via hole penetrates through an upper glass substrate, electrically connecting a structure formed on a semiconductor substrate with an external circuit board, so that electrical signals can be irradiated from the structure through the via hole. A conductive material is filled in the via hole enabling electrical connection between the external circuit board and the structure therethrough.

However, a problem arises when the conductive material is formed in the via hole. Specifically, when the conductive material is filled into the via hole, an air bubble may be generated causing a defective connection between the structure and the circuit board and a subsequent deterioration in quality of the micro electronic parts. In order to prevent formation of a bubble, the via hole may be formed to have a larger diameter because more air bubbles are usually generated in via holes of a smaller diameter. However, in order to provide a via hole of a larger diameter, sizes of a corresponding part and a mounting surface also need to be increased.

Another problem in the conventional method occurs because the conductive material filling the via hole differs from the glass substrate in thermal expansion coefficient. Therefore, a crack may be formed in the glass substrate when the electronic parts go through a thermal change.

In order to ensure that an electrical signal is efficiently irradiated from the structure, a conductive film instead of a conductive material may be provided on an inner wall of the via hole. However, as the via hole is formed in the glass substrate by sand blasting, pieces of broken glass may be generated on the surface of the glass substrate and be bonded to the silicon substrate. Accordingly, when the glass substrate is bonded to the surface of the silicon substrate, a step-shaped portion may be formed due to the presence of the glass pieces between the silicon substrate and the via hole. As a result, connection of the conductive film may be hindered by the step-shaped portion causing a decrease in yield.

Figure 1:
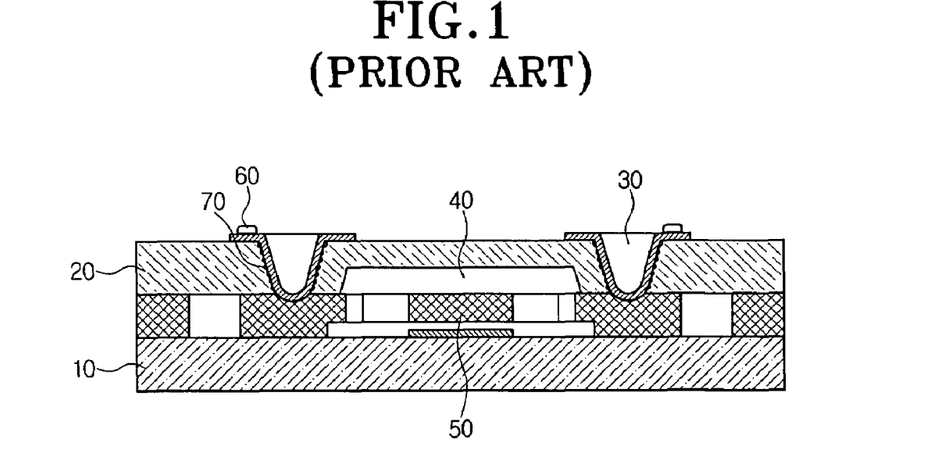
FIG. 1 illustrates a sectional view showing a conventional micro electro-mechanical system.

A solution proposed to the above problems includes a method of manufacturing a micro electronic part using a via hole. FIG. 1 illustrates a main component of the micro electronic part formed by the method, including a silicon substrate 10, a glass substrate 20, a via hole 30 formed through the glass substrate 20, a vacuum chamber 40, micro electronic structure 50 and a micro electronic part having a conductive film. The conductive film is provided inside the via hole 30. An internal wall of the via hole 30 connects the glass substrate 20 to the silicon substrate 10. Therefore, disconnection due to glass pieces between the glass substrate 20 and the silicon substrate 10 may be avoided, and the structure can be electrically connected to the outside through the conductive film and a signal output portion. A soldering bump 60 is provided on a surface of the glass substrate as a part of the conductive film. By bonding the soldering bump 60 to an anodic pad on an external circuit board, the structure can be electrically connected with external devices.

However, sand blasting is used to form the via hole in the proposed solution, generating pieces or chips of broken glass between the silicon substrate and a lower surface of the glass substrate. Accordingly, electrical disconnection from the silicon substrate may still occur. Additionally, electrical disconnection may also occur by the step-shape of the wall 70 of the via hole.

Further, the conductive film is formed in the via hole by sputtering at a high vacuum of less than $10^{-7}$ Torr using vapor depositing equipment, which my cause damage to an element. Accordingly, if the etching process requires more than several microns of vapor deposition for insulation between neighboring electrodes, problem may arise. Also, it is difficult to form fine pitches, and the elements may be damaged.

In addition, forming a bump is difficult because a separate under bump metalization is required. If silk screen or metal plating is used for the under bump metalization, the conductive film may be damaged or contaminated.

Furthermore, position control when assembling the micro electronic part and the external circuit board cannot be expected due to a lack of self-alignment ability.

SUMMARY OF THE INVENTION

Accordingly, it is a feature of an embodiment of the present invention to provide a method for manufacturing a micro electro-mechanical system having a small chip, in which a solder ball is arranged on a glass substrate where a via hole is formed to be electrically connected to a semiconductor substrate and an external circuit board, and which is capable of preventing penetration of air through the via hole.

In an effort to provide these and other features and advantages, an embodiment of the present invention provides a method for manufacturing micro electro-mechanical systems, including (a) forming an insulation layer on an upper surface of a semiconductor substrate and patterning the insulation layer, (b) forming a structure layer on an upper surface of the patterned insulation layer and etching the structure layer, (c) forming an under bump metal on a predetermined position of an upper surface of the structure layer, (d) forming a via hole in a glass substrate corresponding to the position of the under bump metal of the structure layer and in a shape such that the via hole is larger in diameter at an upper surface of the glass substrate than at a lower surface of the glass substrate, wherein the glass substrate is bonded to the upper surface of the structure layer and creates a vacuum chamber that protects a structure of the structure layer; and (e) arranging a solder ball in the via hole and bonding the solder ball to the under bump metal by melting the solder ball.

In (b), the structure layer is preferably formed using an inductively coupled plasma-reaction ion etching (ICP-RIE).

In (d), the via hole is preferably formed using one of sand blasting, laser ablation and wet etching.

In (d), the glass substrate is preferably bonded to the upper surface of the structure layer using either anodic bonding or soldering.

In the method, (d) may further include removing an oxidation layer that is bonded onto the upper surface of the structure layer. Removing the oxidation layer may be performed by printing a flux or by melting under an inert gas atmosphere without the flux.

The semiconductor substrate is preferably a silicon substrate.

In (b), the insulation layer is preferably formed of one selected from the group consisting of Cr/Au alloy, Ti/Au alloy and Cr/Ni/Au alloy.

In (c), the under bump metal is preferably formed of one selected from the group consisting of Cr/Au alloy, Ti/Au alloy, Cr/Ni/Au alloy and Cu/Ni/Au alloy.

In (e), the solder ball is preferably formed of one selected from the group consisting of Sn/Pb alloy, In/Sn alloy, Au/Sn alloy, Ag/Cu alloy, In/Ag alloy, In/Bi alloy, Sn/Bi alloy, Sn/Cu alloy, Ag/Sn alloy, Sn/Ag/Cu alloy, Sn/Ag/Cu/Bi alloy, Sn/Ag/Bi alloy and Sn/Zn alloy.

Another embodiment of the present invention provides a method for manufacturing micro electro-mechanical systems, including (a) forming an insulation layer on an upper surface of a semiconductor substrate and patterning the insulation layer, (b) forming a structure layer on an upper surface of the patterned insulation layer and etching the structure layer, (c) forming a via hole in a predetermined position of a glass substrate and in a shape such that the via hole is larger in diameter at an upper portion of the glass substrate than at a lower portion of the glass substrate, wherein the glass substrate is bonded to an upper surface of the structure layer and creates a vacuum chamber that protects a structure of the structure layer, (d) forming an under bump metal in a bottom of the via hole and forming a via side metal on an inner wall of the via hole, and (e) disposing a solder ball in the via hole and bonding the solder ball with the under bump metal and the via side metal by melting the solder ball.

In (b), the structure layer is preferably formed using an inductively coupled plasma-reaction ion etching (ICP-RIE).

In (c), the via hole is preferably formed using one of sand blasting, laser ablation and wet etching.

In (c), the glass substrate is preferably bonded to the upper surface of the structure layer using either anodic bonding or soldering.

In the method, (d) may further include removing an oxidation layer that is bonded onto the upper surface of the structure layer. Removing the oxidation layer may be performed by printing a flux or by melting under an inert gas atmosphere without the flux.

In (a), the semiconductor substrate is preferably a silicon substrate.

In (b), the insulation layer is preferably formed of one selected from the group consisting of Cr/Au alloy, Ti/Au alloy, and Cr/Ni/Au alloy.

In (d), the under bump metal and the via side metal are preferably formed of one selected from the group consisting of Cr/Au alloy, Ti/Au alloy, Cr/Ni/Au alloy and Cu/Ni/Au alloy.

In (e), the solder ball is preferably formed of one selected from the group consisting of Sn/Pb alloy, In/Sn alloy, Au/Sn alloy, Ag/Cu alloy, In/Ag alloy, In/Bi alloy, Sn/Bi alloy, Sn/Cu alloy, Ag/Sn alloy, Sn/Ag/Cu alloy, Sn/Ag/Cu/Bi alloy, Sn/Ag/Bi alloy and Sn/Zn alloy.

BRIEF DESCRIPTION OF THE DRAWINGS

The above and other features and advantages of the present invention will become more apparent by describing in detail preferred embodiments thereof with reference to the attached drawings, in which.

DETAILED DESCRIPTION OF THE INVENTION

Korean Patent Application No. 2003-11398, filed Feb. 24, 2003, and entitled, "Method For Manufacturing Micro Electro-Mechanical Systems Using Solder Balls," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 2:
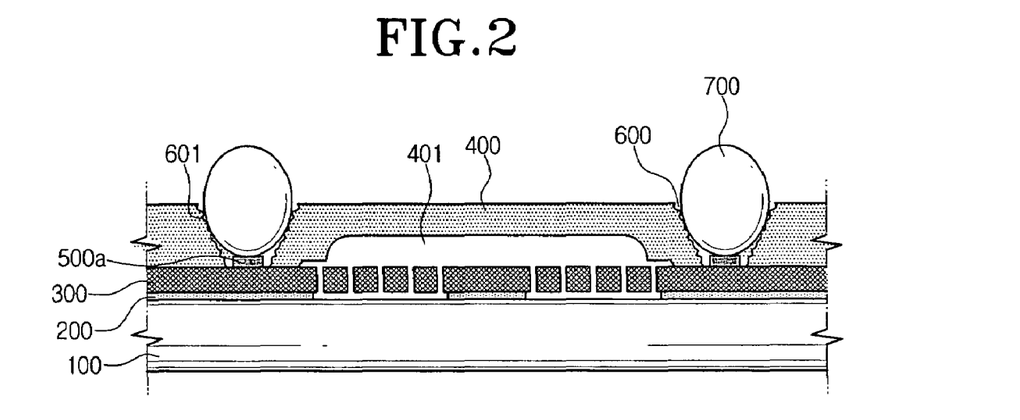
FIG. 2 illustrates a sectional view showing a micro electro-mechanical system according to one preferred embodiment of the present invention.

FIG. 2 illustrates a micro electro-mechanical system fabricated according to a preferred embodiment of the present invention.

Referring to FIG. 2, the micro electro-mechanical system includes a semiconductor substrate 100, an insulation layer 200 formed on an upper surface of the semiconductor substrate 100, a structure layer 300 formed on an upper surface of the insulation layer 200, under bump metals 500a formed in predetermined positions in an upper surface of the structure layer 300, and a glass substrate 400 defining a vacuum chamber 401 that protects a structure on the structure layer 300 and having via holes 600 formed therein corresponding to positions of the under bump metals 500a. Solder balls 700 are disposed inside the via holes 600 and are joined with the under bump metals 500a by melting. Accordingly, the via holes 600, having step-shaped walls 601, are closed by the solder balls 70.

Figure 3:
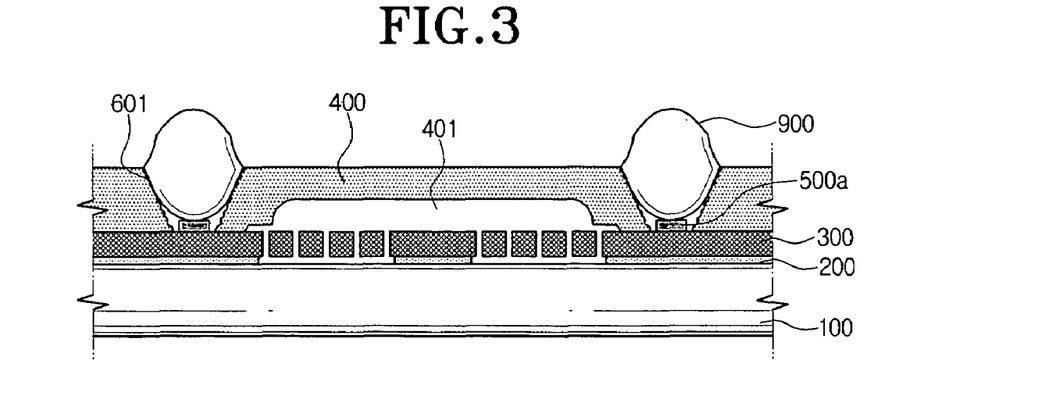
FIG. 3 illustrates a sectional view showing the micro electro-mechanical system of FIG. 2, in which a solder paste is dispensed instead of a solder ball.

FIG. 3 illustrates the micro electro-mechanical system of FIG. 2, but having a solder paste 900 disposed inside the via holes 500a rather than the solder balls 700 as illustrated in FIG. 2. By the presence of the solder paste 900, the via holes 600 with the step-shaped wall 601 are closed.

Figure 4:
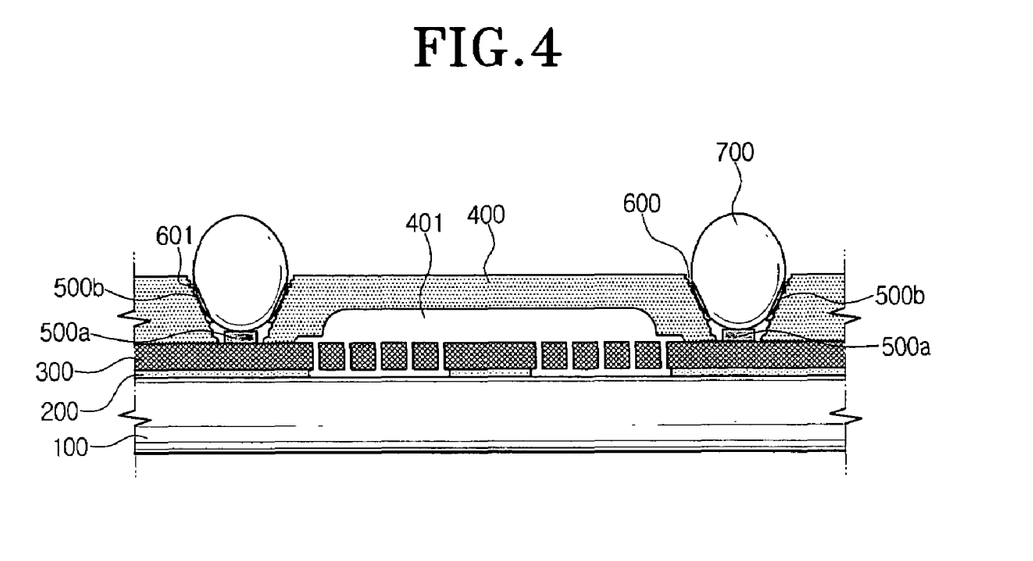
FIG. 4 illustrates a sectional view showing a micro electro-mechanical system as fabricated according to another preferred embodiment of the present invention.

FIG. 4 illustrates a micro electro-mechanical system fabricated according to another preferred embodiment of the present invention.

Referring to FIG. 4, the micro electro-mechanical system includes a semiconductor substrate 100, an insulation layer 200 formed on an upper surface of the semiconductor substrate 100, a structure layer 300 formed on an upper surface of the insulation layer 200, under bump metals 500a formed in predetermined positions of an upper surface of the structure layer 300, and a glass substrate 400 defining a vacuum chamber 401 that protects a structure formed on the structure layer 300 and having via holes 600 formed therein corresponding to positions of the under bump metals 500a. Via side metals 500b are formed in inner walls of the via holes 600, and the solder balls 700 are disposed in the via holes 600 and joined with the under bump metals 500a and the via side metals 500b through melting. Accordingly, the via holes 600, having step-shaped walls 601, are closed by the solder balls 70.

A silicon substrate is preferable for the semiconductor substrate 100, and the insulation layer 200 is preferably formed of one selected from the group consisting of Cr/Au alloy, Ti/Au alloy and Cr/Ni/Au alloy.

Both the under bump metals 500a and the via side metals 500b are preferably formed of one selected from the group consisting of Cr/Au alloy, Ti/Au alloy, Cr/Ni/Au alloy, and Cu/Ni/Au alloy. The solder balls 700 are preferably formed of one selected from the group consisting of Sn/Pb alloy, Au/Sn alloy, Ag/Cu alloy, In/Ag alloy, In/Bi alloy, Sn/Bi alloy, Sn/Cu alloy, Ag/Sn alloy, Sn/Ag/Cu alloy, Sn/Ag/Cu/Bi alloy, Sn/Ag/Bi alloy, and Sn/Zn alloy.

Figure 5:
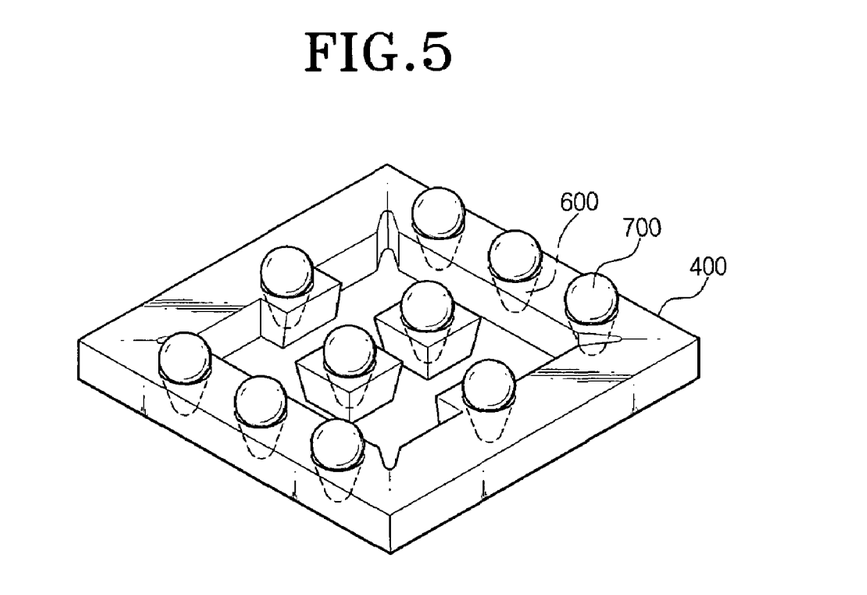
FIG. 5 illustrates a perspective view of a micro electro-mechanical system fabricated and diced according to a preferred embodiment of the present invention.

FIG. 5 illustrates a micro electro-mechanical system fabricated according to a preferred embodiment of the present invention being diced.

FIGS. 6A to 6F illustrate in detail a method for manufacturing micro electro-mechanical systems according to preferred embodiments of the present invention.

Figure 6A:
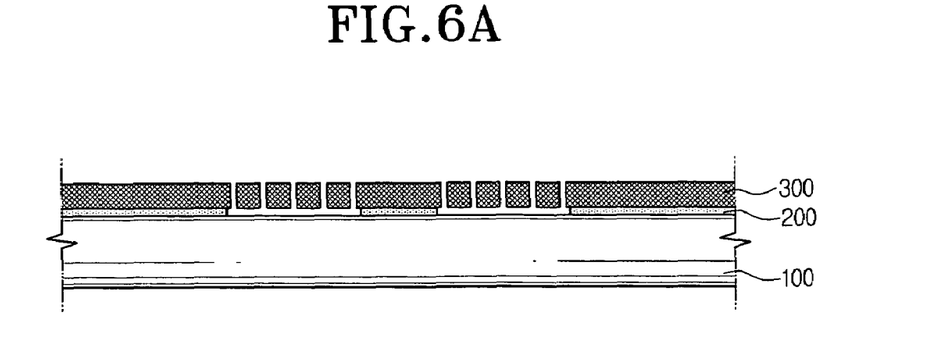
FIGS. 6A to 6F illustrate sectional views showing a micro electro-mechanical system being fabricated according to a preferred embodiment of the present invention.

Referring first to FIG. 6A, the insulation layer 200, which may be a sacrificial layer, is formed on the silicon substrate that is provided as the semiconductor substrate 100. The structure layer 300 is formed on an upper surface of the insulation layer 200, and an etching process is performed. Next, on the structure layer 300 structures of wafer level packaging such as a gyroscope sensor or an acceleration sensor are formed using inductively coupled plasma-reaction ion etching (ICP-RIE).

Figure 6B:
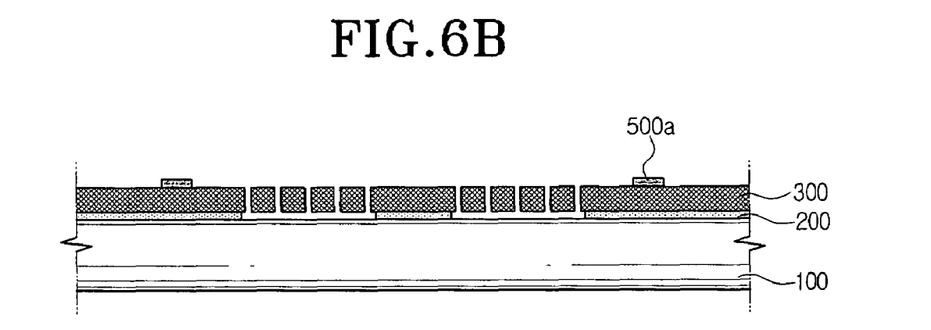

Referring to FIG. 6B, a layer (not shown) of Cr/Au alloy, Ti/Au alloy, Cr/Ni/Au alloy or Cu/Ni/Au alloy is formed on an upper surface of the structure layer 300 by vapor deposition, and the layer is patterned to form the under bump metals 500a on the structure layer 300 in predetermined locations.

Figure 6C:
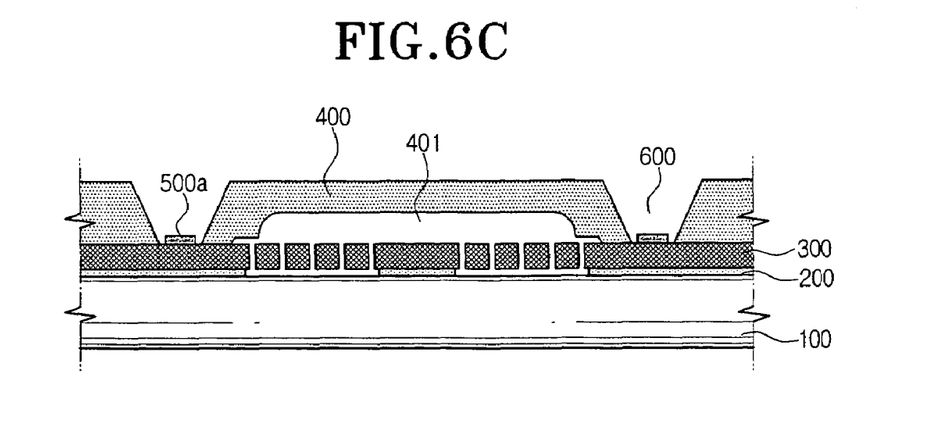

Referring next to FIG. 6C, the glass substrate 400 is joined to the structure layer 300 by anodic bonding. Generally, anodic bonding is achieved by connecting an electrode to a glass substrate having a silicon or other oxidizable layer coated thereon, applying a voltage of more than several hundred volts to the glass substrate, and subsequently forming an oxidation layer on a boundary of the glass substrate and the that to which it is being bonded.

Alternatively, the structure layer 300 and the glass substrate 400 may be joined by soldering rather than anodic bonding. In general, soldering is a process using adhesives, in which solder is vapor-deposited, plated or printed and then heated to bond items together. In a case of melting a solder ball, flux is printed or dispensed to remove the oxidation layer. Melting without flux under an inert gas atmosphere is also possible.

The glass substrate 400 is formed to have a space therein such that a vacuum 401 is created to protect the structure formed on the structure layer 300.

The via holes 600 are formed in the glass substrate 400 by sand blasting. The via holes 600 are formed to have an inverse triangle shape, which is larger in diameter at an upper portion of the glass substrate 400 than at a lower portion thereof, which is a contact area between the glass substrate 400 and the structure layer 300.

Figure 6D:
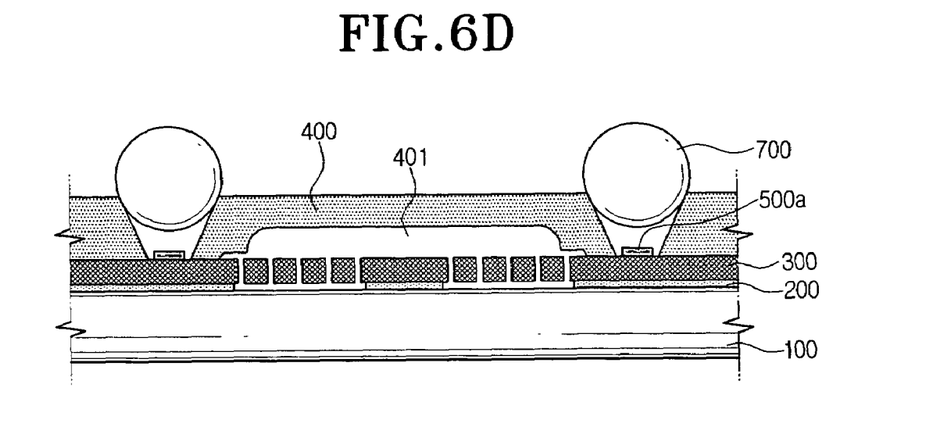

Next, referring to FIG. 6D, the solder balls 700 are disposed in the via holes 600 using solder ball placement equipment. The inverse triangle shape of the via holes 600 allows easy positioning of the solder balls 700 therein. Next, the solder balls 700 in the via holes 600 are contacted with the under bump metals 500a either by laser or by applying a predetermined pressure thereto.

Figure 6E:
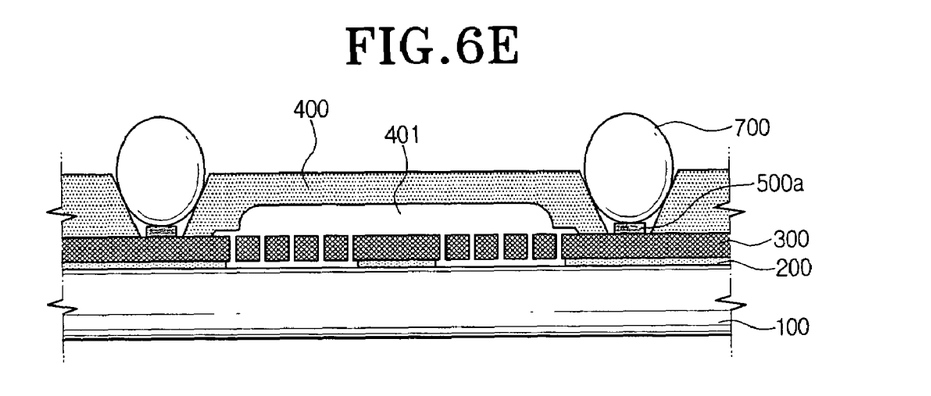

Referring to FIG. 6E, the solder balls 700 and the under bump metals 500a are joined with each other using thermal chemical binding by heating the micro electro-mechanical system under an inert gas atmosphere at a temperature above a melting point of the solder. Because the solder balls 700 are melted in the contact holes 600 to be bonded with the under bump metals 500a, it is not necessary to form a conductive film in the contact holes 600 to provide an electrical connection between the micro electro-mechanical system and an external substrate. Therefore, damage to the substrate due to sputtering is prevented. Accordingly, it can be compared to the conventional process in which via holes 600 are formed by sand blasting or other methods and during the process, pieces of broken glass are produced, causing step-shaped portions on the inner walls of the via holes 600 and subsequent disconnection. By connecting the joined structure of the solder balls 700 and the under bump metals 500a tightly against the inner wall of the via hole 600, leakage through empty space under the solder balls 700 or through step-shaped portions may be prevented.

After the solder balls 700 and the under bump metals 500a are joined, remaining substances are removed from a resultant structure, and the system is diced. If the flux is used, cleaning is performed to remove the flux, and in other cases, the system is diced without undergoing a separate cleaning process. FIG. 5 shows the micro electro-mechanical system according to a preferred embodiment of the present invention after being diced.

Figure 6F:
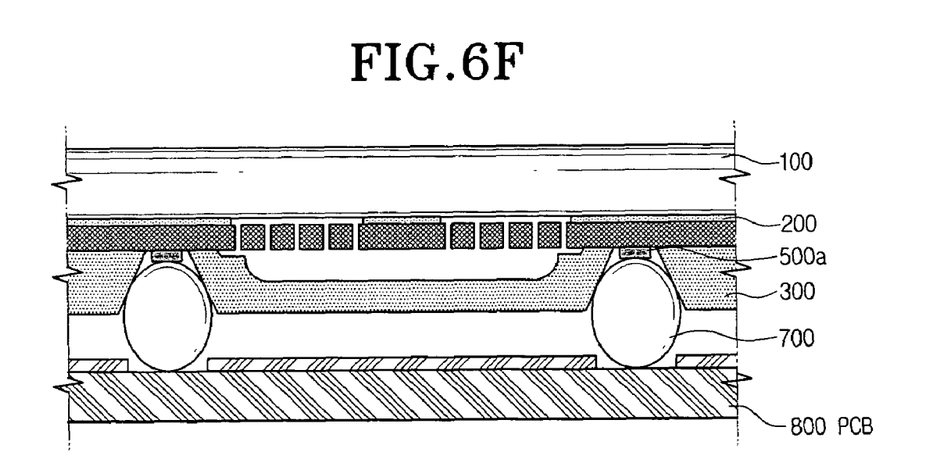

Referring to FIG. 6F, the micro electro-mechanical system fabricated according to the present invention can be bonded to an external printed circuit board (PCB) 800 by a flip-chip method. That is, the micro electro-mechanical system is flipped and the solder balls 700 are placed at predetermined positions on the external PCB 800 and the solder balls 700 are joined to the external PCB 800 by heating the solder balls 700 at a temperature above the melting point of the solder.

Figure 7:
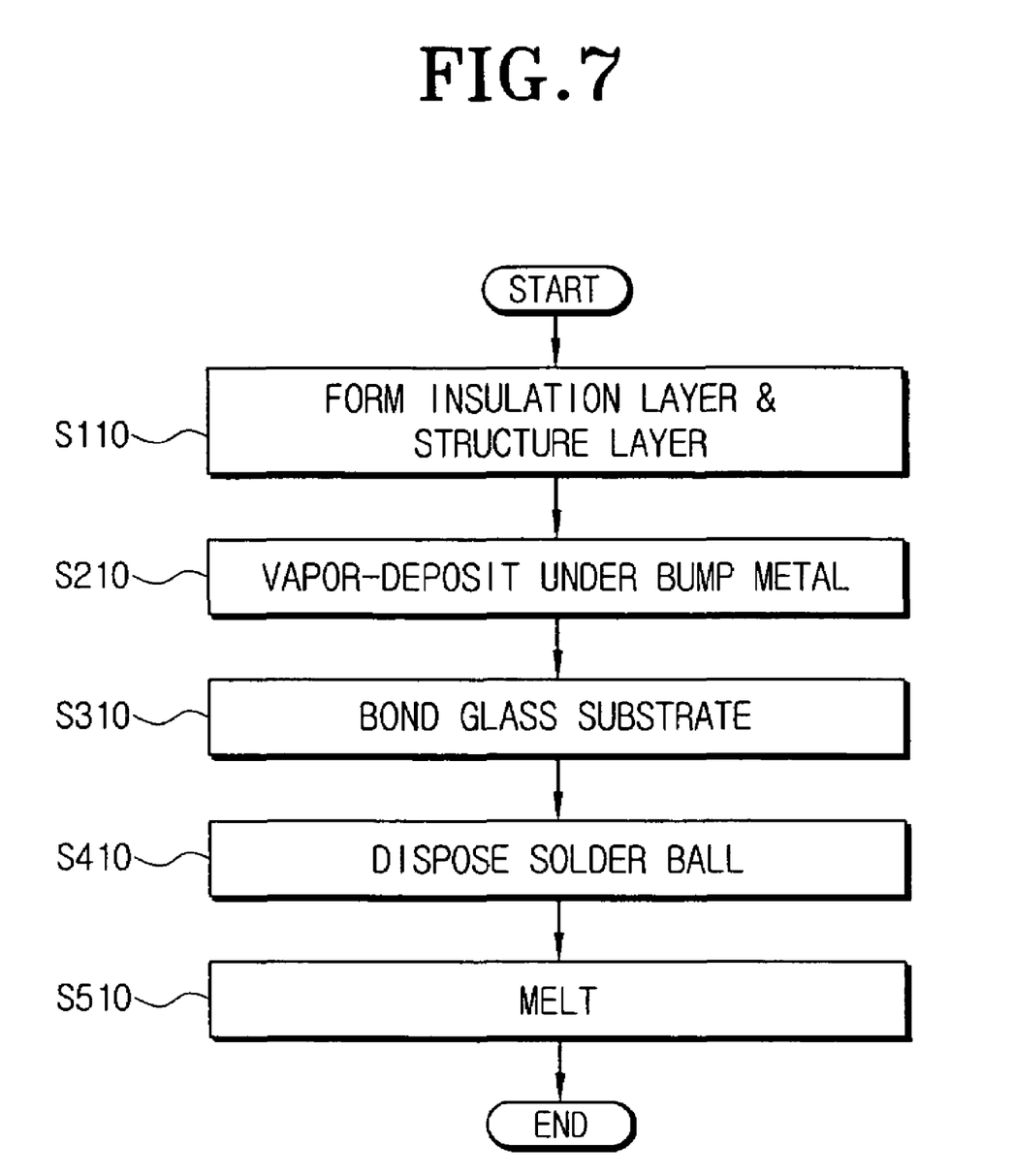
FIG. 7 is a flowchart illustrating a method for manufacturing micro electro-mechanical systems according to a preferred embodiment of the present invention.
Figure 8:
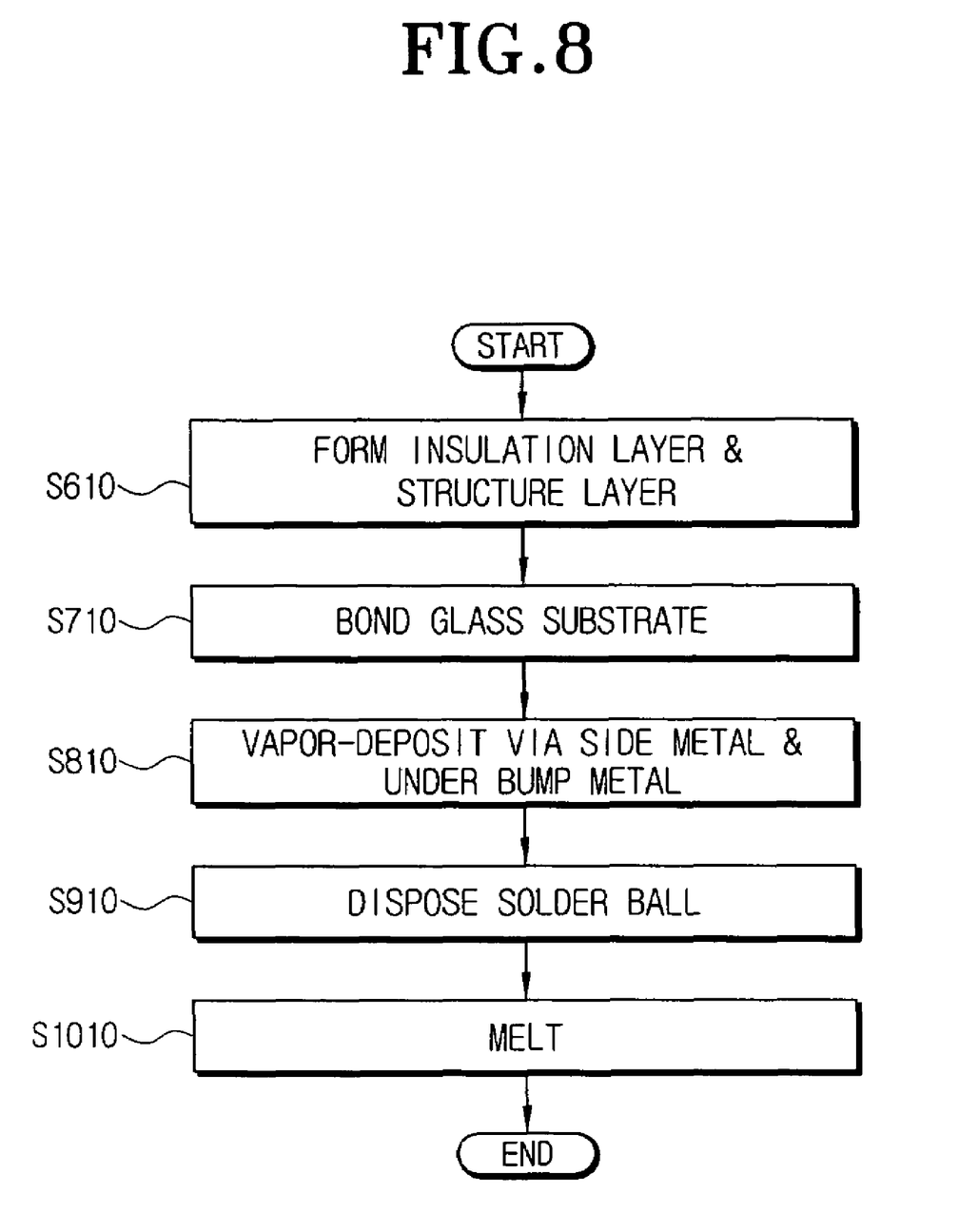
FIG. 8 is a flowchart illustrating a method for manufacturing micro electro-mechanical systems according to another preferred embodiment of the present invention.

FIGS. 7 and 8 are flowcharts illustrating a method for manufacturing micro electro-mechanical systems according to preferred embodiments of the present invention.

Referring to FIG. 7, first, an insulation layer and a structure layer are formed (step S110). Next, under bump metals are deposited on the upper surface of the structure layer by vapor deposition (step S210), and a glass substrate is bonded to the structure layer (step S310). Solder balls are positioned in via holes formed in the glass substrate (step S410), and then melted (step S510). As a result, a micro electro-mechanical system according to a preferred embodiment of the present invention is fabricated.

Referring to FIG. 8, first, an insulation layer (or sacrificial layer) and a structure layer are formed (step S610), and a glass substrate is bonded to an upper surface of the structure layer (step S710). Next, via side metals are vapor-deposited on inner walls of via holes of the glass substrate and under bump metals are vapor deposited in bottoms of the via holes (step S810). Solder balls are disposed in the via holes (step S910) and melted (step S1010), and as a result, a micro electro-mechanical system according to another preferred embodiment of the present invention is fabricated.

A method for manufacturing micro electro-mechanical systems according to the present invention will be described in greater detail with reference to FIG. 8.

First, an insulation layer is formed on a silicon substrate, which is a semiconductor substrate, and then a structure layer is formed thereon. A structure for wafer level packaging such as a gyroscope sensor or an acceleration sensor is formed on the structure layer by an inductively coupled plasma-reaction ion etching (ICP-RIE) process.

A glass substrate is bonded onto the structure layer by anodic bonding. Soldering, instead of anodic bonding, may be used to bond the structure layer with the glass substrate.

On a plane where via holes of the glass substrate and the structure layer meet, under bump metals are formed, and via side metals are formed on inner walls of the via holes. The under bump metals may be formed of one selected from the group consisting of Cr/Au alloy, Ti/Au alloy, and Cr/Ni/Au alloy through vapor-deposition and patterning, and the via side metals may be formed of one selected from the group consisting of Cr/Au alloy, Ti/Au alloy, Cr/Ni/Au alloy and Cu/Ni/Au alloy also through vapor-deposition and patterning.

In the case of melting solder balls, flux is printed or dispensed in order to remove the oxidation layer. Melting is also possible under an inert gas atmosphere such as Ar or $N_2$ without flux.

Solder balls are positioned in the via holes using solder ball placement equipment. In the case of forming via holes in the glass substrate through sand blasting, the via holes are shaped to the shape of an inverse triangle, which is larger in diameter at an upper portion of the glass substrate than at a plane where the glass substrate meets the structure layer. Due to the inverse triangular shape of the via holes, the solder balls can be easily positioned in the via holes. Next, the solder balls are contacted to the under bump metals and the via side metals either using a laser or by applying a predetermined pressure.

Then, the solder balls are joined with the under bump metals and the via side metals through thermal chemical bonding by heating the micro electro-mechanical system at a temperature above a melting point of the solder balls under an inert gas atmosphere. Because the solder balls are contacted with the under bump metals and the via side metals as described above, there is no need to form a conductive film in the via holes to electrically connect the micro electro-mechanical system with an external substrate. Accordingly, the present invention can solve the problem of the conventional case in which pieces of broken glass are produced during the formation of the via holes through sand blasting, and the broken glass pieces cause step-shaped portions in inner walls of the via holes between the glass substrate and the silicon substrate contacted with the glass substrate. Furthermore, because the solder balls are joined with the under bump metals and the via side metals, leakage through an empty space below the solder balls and step-shaped portions in the sides of the via holes can be prevented.

When the solder balls are joined with the under bump metals and the via side metals, material remaining on the micro electro-mechanical system is removed and a dicing process is performed. In the case of using flux, cleaning is performed to remove the flux. If flux is not used, the system undergoes the dicing process without an additional cleaning process. FIG. 5 illustrates a micro electro-mechanical system according to a preferred embodiment of the present invention after the dicing process.

As described above, the micro electro-mechanical system fabricated according to the present invention can be bonded to an external PCB by a flip-chip method. That is, the micro electro-mechanical system is flipped so that solder balls in via holes are aligned with predetermined locations on the external PCB. Then, by heating at a temperature above a melting point of the solder balls, the solder balls are bonded to the external PCB.

According to the present invention, the problem of having pieces of broken glass produced at the lower end of the glass substrate during sand blasting for formation of the via holes, formation of step-shaped portions due to the glass pieces, and subsequent electrical disconnection from the external substrate due to the step-shaped portions, can be prevented. Furthermore, in the micro electro-mechanical systems according to the present invention, because the under bump metals and the via side metals are joined with the solder balls by melting and are electrically connected with each other, there is no need for an additional conductive film in the via holes, and accordingly, damage to the system by sputtering of vapor-deposition equipment under a high vacuum below $10^{-7}$ Torr can be prevented.

Furthermore, arrangement of solder balls in the via holes is made easier because of the inverted triangular shape of the via holes, and joining with the external PCB also becomes easier because the solder balls forming bumps on the glass substrate make alignment of the PCB with the glass substrate easier.

With the micro electro-mechanical system using solder balls according to the present invention, solder balls are joined with under bump metals and/or via side metals and thus allow electrical connection of electrical signals inside the system with external electrical parts. As a result, a defective electrical connection may be prevented, and realization of a flip-chip is enabled. Accordingly, a compact-sized product may be produced.

Furthermore, wire bonding can be omitted and automatic arrangement of the solder balls in the via holes of the glass substrate is enabled. Because automation is enabled, benefits such as an increase in yield and a decrease in manufacturing costs may be obtained. Also, leakage through step-shaped portions in the via holes of the glass substrate may be prevented by the presence of the solder balls, and performance may therefore be increased. In addition, since the system can be arranged with respect to an external PCB in the form of a flip-chip, a connecting process becomes simplified, and benefits such as high integration and compactness may be obtained. As a result, a number of signal input/output terminals with respect to a unit area may be increased and reduced in size. Finally, since there is no need for a separate die attachment, accuracy in the assembling arrangement may be improved.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for manufacturing micro electro-mechanical systems, comprising:
   (a) forming an insulation layer on an upper surface of a semiconductor substrate and patterning the insulation layer;
   (b) forming a structure layer on an upper surface of the patterned insulation layer and etching the structure layer;
   (c) forming an under bump metal on a predetermined position of an upper surface of the structure layer;
   (d) forming a via hole in a glass substrate corresponding to the position of the under bump metal of the structure layer and in a shape such that the via hole is larger in diameter at an upper surface of the glass substrate than at a lower surface of the glass substrate, wherein the glass substrate is bonded to the upper surface of the structure layer and creates a vacuum chamber that protects a structure of the structure layer; and
   (e) arranging a solder ball in the via hole and bonding the solder ball to the under bump metal by melting the solder ball.

2. The method for manufacturing micro electro-mechanical systems as claimed in claim 1, wherein in (b), the structure layer is formed using an inductively coupled plasma-reaction ion etching (ICP-RIE).

3. The method for manufacturing micro electro-mechanical systems as claimed in claim 1, wherein in (d), the via hole is formed using one selected from the group consisting of sand blasting, laser ablation and wet etching.

4. The method for manufacturing micro electro-mechanical systems as claimed in claim 1, wherein in (d), the glass substrate is bonded to the upper surface of the structure layer using either anodic bonding or soldering.

5. The method for manufacturing micro electro-mechanical systems as claimed in claim 1, wherein (d) further comprises removing an oxidation layer, which is bonded onto the upper surface of the structure layer.

6. The method for manufacturing micro electro-mechanical systems as claimed in claim 5, wherein the oxidation layer is removed either by printing a flux or by melting under an inert gas atmosphere without the flux.

7. The method for manufacturing micro electro-mechanical systems as claimed in claim 1, wherein in (a), the semiconductor substrate is a silicon substrate.

8. The method for manufacturing micro electro-mechanical systems as claimed in claim 1, wherein in (b), the insulation layer is formed of one selected from the group consisting of Cr/Au alloy, Ti/Au alloy and Cr/Ni/Au alloy.

9. The method for manufacturing micro electro-mechanical systems as claimed in claim 1, wherein in (c), the under bump metal is formed of one selected from the group consisting of Cr/Au alloy, Ti/Au alloy, Cr/Ni/Au alloy and Cu/Ni/Au alloy.

10. The method for manufacturing micro electro-mechanical systems as claimed in claim 1, wherein in (e), the solder ball is formed of one selected from the group consisting of Sn/Pb alloy, In/Sn alloy, Au/Sn alloy, Ag/Cu alloy, In/Ag alloy, In/Bi alloy, Sn/Bi alloy, Sn/Cu alloy, Ag/Sn alloy, Sn/Ag/Cu alloy, Sn/Ag/Cu/Bi alloy, Sn/Ag/Bi alloy and Sn/Zn alloy.

11. A method for manufacturing micro electro-mechanical systems, comprising:
   (a) forming an insulation layer on an upper surface of a semiconductor substrate and patterning the insulation layer;
   (b) forming a structure layer on an upper surface of the insulation layer and etching the structure layer;
   (c) forming a via hole in a predetermined position of a glass substrate and in a shape such that the via hole is larger in diameter at an upper portion of the glass substrate than at a lower portion of the glass substrate, wherein the glass substrate is bonded to an upper surface of the structure layer and creates a vacuum chamber that protects a structure of the structure layer;
   (d) forming an under bump metal in a bottom of the via hole and forming a via side metal on an inner wall of the via hole; and
   (e) disposing a solder ball in the via hole and bonding the solder ball with the under bump metal and the via side metal by melting the solder ball.

12. The method for manufacturing micro electro-mechanical systems as claimed in claim 11, wherein in (b), the structure layer is formed using an inductively coupled plasma-reaction ion etching (ICP-RIE).

13. The method for manufacturing micro electro-mechanical systems as claimed in claim 11, wherein in (c), the via hole is formed using one selected from the group consisting of sand blasting, laser ablation and wet etching.

14. The method for manufacturing micro electro-mechanical systems as claimed in claim 11, wherein in (c), the glass substrate is bonded to the upper surface of the structure layer using either anodic bonding or soldering.

15. The method for manufacturing micro electro-mechanical systems as claimed in claim 11, wherein (d) further comprises removing an oxidation layer, which is bonded onto the upper surface of the structure layer.

16. The method for manufacturing micro electro-mechanical systems as claimed in claim 15, wherein the oxidation layer is removed either by printing a flux or by melting under an inert gas atmosphere without the flux.

17. The method for manufacturing micro electro-mechanical systems as claimed in claim 11, wherein in (a), the semiconductor substrate is a silicon substrate.

18. The method for manufacturing micro electro-mechanical systems as claimed in claim 11, wherein in (b), the insulation layer is formed of one selected from the group consisting of Cr/Au alloy, Ti/Au alloy, and Cr/Ni/Au alloy.

19. The method for manufacturing micro electro-mechanical systems as claimed in claim 11, wherein in (d), the under bump metal and the via side metal are formed of one selected from the group consisting of Cr/Au alloy, Ti/Au alloy, Cr/Ni/Au alloy and Cu/Ni/Au alloy.

20. The method for manufacturing micro electro-mechanical systems as claimed in claim 11, wherein in (e), the solder ball is formed of one selected from the group consisting of Sn/Pb alloy, In/Sn alloy, Au/Sn alloy, Ag/Cu alloy, In/Ag alloy, In/Bi alloy, Sn/Bi alloy, Sn/Cu alloy, Ag/Sn alloy, Sn/Ag/Cu alloy, Sn/Ag/Cu/Bi alloy, Sn/Ag/Bi alloy and Sn/Zn alloy.

* * * * *